United States Patent [19]

Fuse

[11] Patent Number: 5,223,445
[45] Date of Patent: Jun. 29, 1993

[54] LARGE ANGLE ION IMPLANTATION METHOD

[75] Inventor: Genshu Fuse, Toyonaka, Japan

[73] Assignee: Matsushita Electric Industrial Co., Ltd., Osaka, Japan

[21] Appl. No.: 707,801

[22] Filed: May 30, 1991

[30] Foreign Application Priority Data

May 30, 1990 [JP] Japan ............................ 2-140951
Mar. 11, 1991 [JP] Japan ............................ 3-044771

[51] Int. Cl.$^5$ .................. H01L 21/336; H01L 21/425
[52] U.S. Cl. ........................ 437/24; 437/35; 437/44; 437/80
[58] Field of Search .................... 437/24, 35, 44, 80

[56] References Cited

FOREIGN PATENT DOCUMENTS

| | | | |
|---|---|---|---|
| 52-72585 | 6/1977 | Japan | 437/35 |
| 56-27922 | 3/1981 | Japan | 437/24 |
| 59-119870 | 7/1984 | Japan | 437/44 |
| 59-198763 | 11/1984 | Japan | 437/35 |
| 61-185950 | 8/1986 | Japan | 437/24 |
| 1-196818 | 8/1989 | Japan | 437/24 |

OTHER PUBLICATIONS

Hori, "¼Man LATID (Large Tilt Angle Implanted Drain) Technology for 3.3 V Operation", IEDM 1989, pp. 777–780.
Wolf et al., "Silicon processing for the VLSI Era vol. I: Process technology", Lattice Press, 1986, pp. 292–294.
Horiuchi et al., "Three dimensional solid-phase epitaxial regrowth from as implanted Si", J. Appl. Phys., 65(6), Mar. 15, 1989, pp. 2238–2242.
Hori et al., "A New Sub-micron MOSFET with LATID (Large angle tilt implanted Drain) structure", Proc. 1988 Symp. VLSI Technology, San Diego, pp. 15–16.

*Primary Examiner*—Olik Chaudhuri
*Assistant Examiner*—Ourmazd S. Ojan
*Attorney, Agent, or Firm*—Wenderoth, Lind & Ponack

[57] ABSTRACT

An ion implanting method which suppresses defects by changing the shape of the amorphous layer formed by ion injection from that of a conventional device.

After forming a mask pattern on a semiconductor wafer, amorphous layers are then formed with sufficient penetration under the mask material by implanting ions at an implant angle greater than or equal to 20 degrees with a dose amount enough for forming amorphous layers. In this large angle ion implanting method, the edge of each amorphous layer becomes dull and, thereby, no voids are formed in a successive heat treatment.

10 Claims, 10 Drawing Sheets

0.1 μm 0.1 μm

LARGE ANGLE ION IMPLANTATION METHOD

BACKGROUND OF THE INVENTION

1. Field of the Invention

The present invention relates to an ion implantation method which suppresses defect generation in very-large scale integration semiconductor devices.

2. Description of the Prior Art

The high density of current conventional semiconductor devices causes increased stress, which results in a condition in which defects can grow with extreme ease. Defect growth in a conventional semiconductor device is described below with reference to FIG. 14 using a MOS transistor as an example.

As shown in FIG. 14 (a), this device comprises a semiconductor substrate 1, MOS transistor gate electrode 2, an area of exposed oxide 3 for LDD (lightly doped drain) structure formation, a high concentration n+ area 5 formed by arsenic ion in the semiconductor substrate 1, and an amorphous layer 6 formed at the same time due to damage upon ion implantation in the semiconductor substrate 1. Reference number 4 indicates the arsenic ion beam used to form the source-drain area.

When the substrate is subjected to a heat treatment crystal regrowth occurs in the amorphous layer 6 and proceeds in two orthogonal directions at the corner thereof as shown in FIG. 14 (b): up from the bottom side of the substrate in direction 7, and in a horizontal direction 9. As a result, a void 10 where a crystal discontinuity exists is generated where the two directions of crystal regrowth collide, and a defect is thus formed. When a stress is applied to this defect area, the defect grows from the void 10. Tamura et al. have reported in the literature (Nuclear Instruments and Methods, B37/38, p. 329, 1989) on the formation of voids in this area.

Horiuchi et. al. [J. Appl. Phys., 65(6), Mar. 15, 1989, p.2238] proposes a method using a tapered mask. In this method, as shown in FIG. 6, there is formed a mask 201 of an oxide film with a tapered side surface. When an ion implantation is carried out in a vertical direction (an incident angle 0° to 7°) due to the tapered side surface of the mask 201, an edge or a corner portion of an amorphous layer 6 underlying the mask is formed tapered similarly to the taper of the mask. In other words, the side surface of the edge thereof has a dull angle. Thus, this method is an effective one for forming a dull edge of the amorphous layer to suppress defect generation.

However, in this method a pattern shift from a mask forming area is apt to be caused due to the formation of the taper and this is extremely inconvenient because the size of the device is miniaturized to one half of sub-micron order or less. In other words, this method is applicable only for devices having a relatively large size.

Further, since the reproducibility of taper etching is not so good, it is not applicable for super ULSI.

PROBLEM TO BE SOLVED BY THE INVENTION

In a conventional ion implantation method as described above, the crystal defect growth rate inevitably rises due to the formation of voids 10, and leakage current flows through pn junctions in the device because defects are grown so as to cross pn junction highly sensitive to them. This results in a significant drop in good product yield because sufficient characteristics cannot be reliably obtained. This problem is found not only in the source-drain structure, but also whenever an amorphous layer is formed by high concentration implantation using a mask. Because mechanical stress increases in the ultra-high density devices manufactured today, the leakage current also increases and good devices cannot be manufactured.

The object of the present invention is therefore to provide an ion implantation method which suppresses defect generation by changing the shape of the amorphous layer formed by ion implantation.

SUMMARY OF THE INVENTION

One object of the present invention is to provide a large angle ion implanting method being capable of forming amorphous layers in a semiconductor substrate each of which is formed to have a dull edge.

Another object of the present invention is to provide an ion implanting method for forming amorphous layers which is able to suppress voids upon recrystallization of said amorphous layers in a successive heat treatment.

In order to achieve these objects, according to the present invention, there is provided a large angle ion implanting method for forming amorphous layers in a semiconductor substrate comprising a step of forming a mask pattern on said semiconductor substrate, said mask pattern having apertures for forming said amorphous layers and a step of implanting ions into said semiconductor substrate through said apertures of said mask pattern at a large implant angle equal to twenty degrees or more with a dose amount necessary for forming said amorphous layers in said semiconductor layer. It is to be noted that while Hori et al. reported a large angle ion implantation method at the 1988 VLSI Symposium as reported on page fifteen of the proceedings, in their method the amount of ion implantation was not sufficient to form an amorphous layer as does the present invention.

FIG. 8 shows temperature dependence of the critical dose for silicon amorphization by boron, arsenic, bismuth, antimony and phosphorous. As is understood therefrom, in the case of arsenic ion implantation silicon is completely amorphized by a dose of about $1 \times 10^{14}$ cm$^{-2}$ at room temperature of the substrate. Germanium has a critical dose similar to that of As. Thus, the dose amount employed in Hori et. al. is too small to form an amorphous layer.

OPERATION

When ion implantation is performed at a relatively large angle to the substrate on which a mask is formed according to the method of the invention, crystal growth during recrystallization in heat treatment does not proceed in two directions nearly orthogonal to each other and the nuclei of defect growth known as voids therefore do not occur because the amorphous layer formation has a gently sloping shape at the corner of the amorphous layer when compared with the inversely tapered configuration resulting from the ion implantation at a near-perpendicular angle according to the conventional method mentioned above. As a result, LSI devices with few abnormalities caused by defects can be achieved because defects hardly grow even under the comparatively high stress conditions of the secondary processing.

EFFECT OF THE INVENTION

According to the present invention as described above, because defect nuclei are not formed even under high stress conditions, there is no drop in LSI yields observed with an increase in leakage current electrical characteristics, and the practical effect is extremely great.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

First embodiment

Figure 1A:
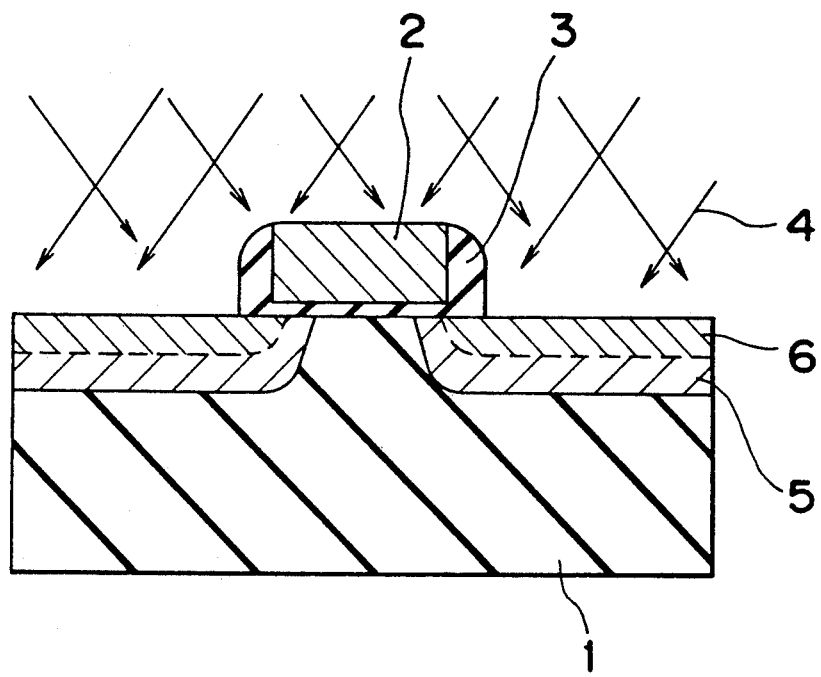
FIG. 1(a) is a schematical cross-sectional view of a semiconductor device for showing a large angle ion implantation according to a first preferred embodiment of the present invention.

FIG. 1 is a cross section illustrating the manufacturing process of a semiconductor device in a first embodiment of the present invention. In FIG. 1 (a), reference numeral 1 indicates a p-type silicon substrate, 2 is a polysilicon gate, and 3 is an oxide film sidewall. Ion implantation is accomplished using a rotating or steping rotating implanting method wherein the implantation angle of an arsenic ion beam 4 is varied from 20 to 60 degrees. The dose amount should be greater than $1 \times 10^{14}$ cm$^{-2}$ in order to form an amorphous layer at an implantation angle of 20 degrees, and a dose amount of $4 \times 10^{15}$ cm$^{-2}$ was employed in the present embodiment. At other angles, the dose amount was adjusted so that a product of the dose amount with a cosine of the implantation angle coincides with that at 20 degrees.

As shown in FIG. 1(a), under these implanting conditions an n-type layer 5 was formed in a proper depth of the substrate 1 and an amorphous layer 6 was formed on the n-type layer 5. These two layers 5 and 6 were formed buried beneath the side wall 3.

Figure 1B:
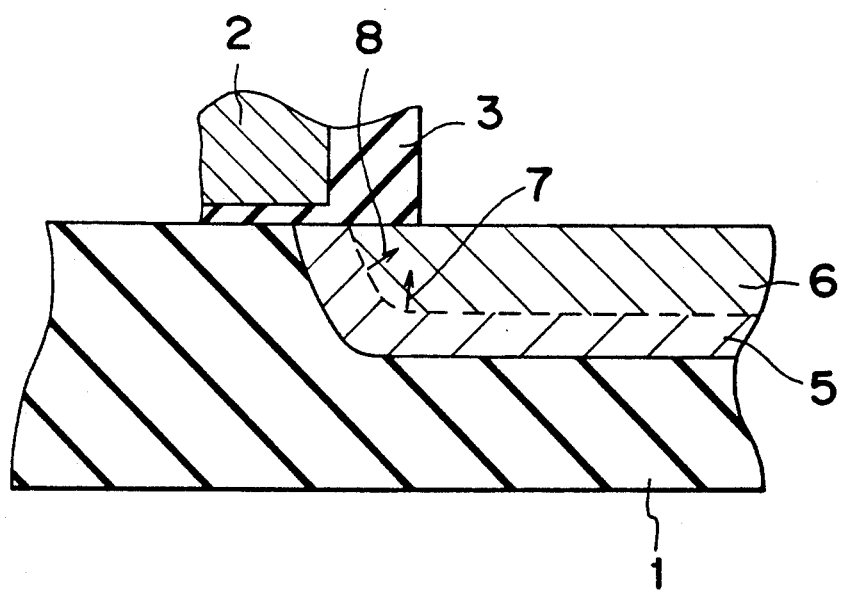
FIG. 1(b) is an enlarged view of a part of FIG. 1.

As shown in an enlarged scale in FIG. 1(b), according to the present embodiment, the angle of the bottom corner of the amorphous layer 6 becomes dull. This means that two directions of crystal regrowth indicated by reference numerals 7 and 8 which is caused by a later heat treatment never meet with each other in the amorphous layer 6. In other words, crystal regrowth starting from the bottom and the side at the corner thereof never interfere with each other and, accordingly, no large voids forming nuclei of defects are generated therein during the heat treatment.

Furthermore, because the n-type layer 5 includes the amorphous layer 6, any defect layer will not cross the junction area, and leakage current in the junction area caused by the defect layer can be eliminated.

Figure 8:
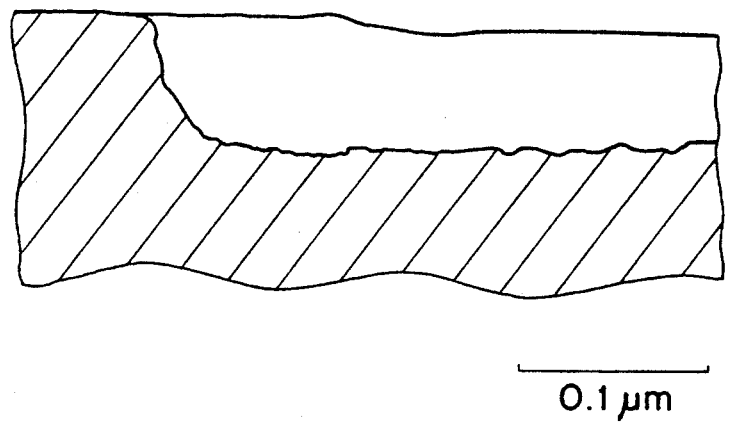
FIGS. 8 and 9 are cross-sectional views of the amorphous layer obtained at large and small implant angles.
Figure 9:
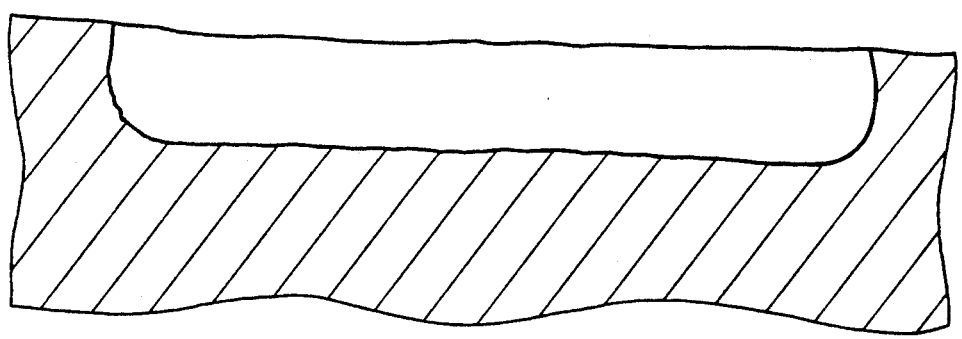

FIGS. 8 and 9 show enlarged cross-sectional views obtained from cross-sectional TEM photographs wherein the arsenic ion implanting angle of FIG. 8 was 60° and those of FIG. 9 were ±7°.

As shown in FIG. 8, the corner of the amorphous layer was formed dull by the large angle implantation. Contrary to this, corner angles were ±7° for ±7° implantation, as shown at left and right sides of FIG. 9, respectively.

Figure 10:
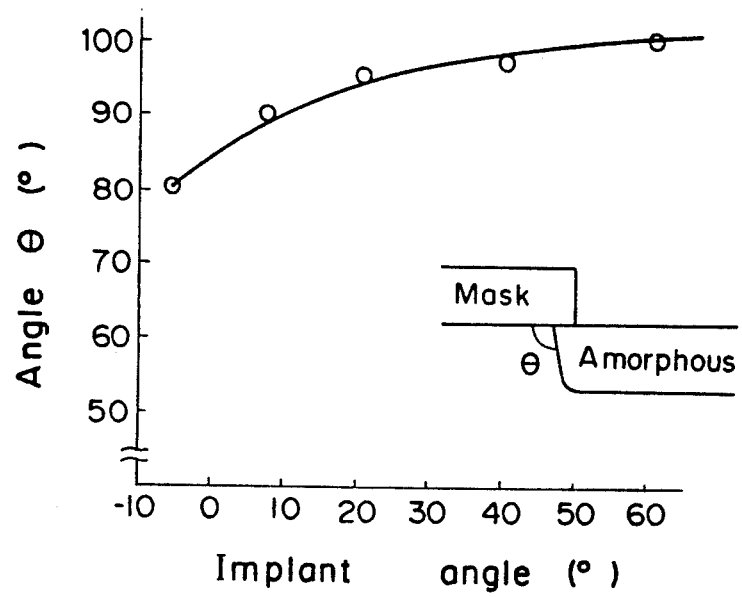
FIG. 10 is a graph showing a relation between the implant angle and the edge angle of the amorphous layer.

FIG. 10 shows a relation between the implanting angle and an angle θ, which becomes larger than 90° when the implanting angle is set at 20° and increases gradually to 100° as the implanting angle increases from 20° to 60°.

Figure 11:
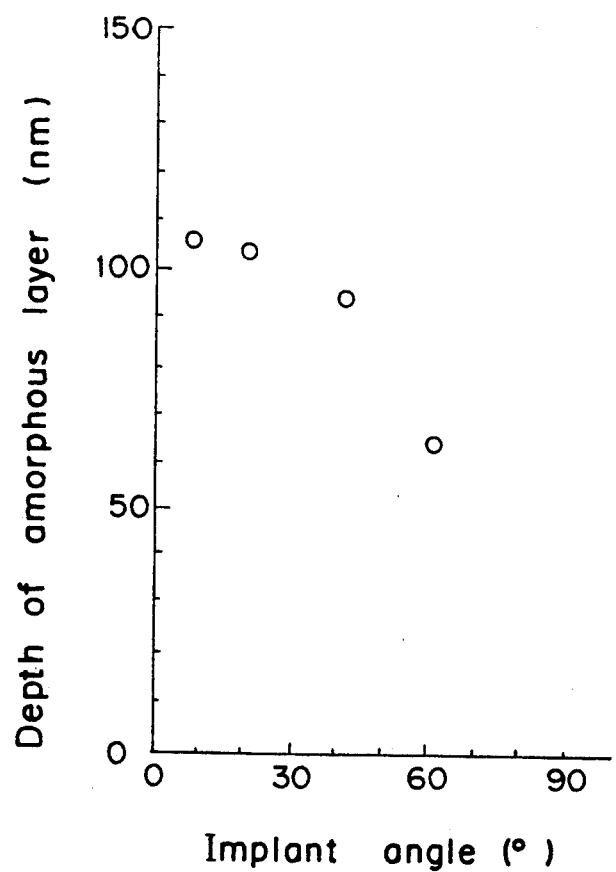
FIG. 11 is a graph showing a relation between the implant angle and the depth of amorphous layer.

FIG. 11 shows a relation between the implant angle and the depth of the amorphous layer formed by the arsenic ion implantation. Since ions implanted scatter in a lateral direction, the depth is not decreased according to a cosine of the implant angle. However too large implant angle exceeding 60° is not so efficient for obtaining a depth needed for the amorphous layer.

A 10 nm oxidation process was then applied, a 300 nm protective oxidation layer deposited, contacts formed in respective source-drain areas, and, thereby, a test transistor group with a number of transistors equivalent to a 1M DRAM device was formed.

A device yield test of transistor groups thus manufactured was made by measuring a current flowing when 5V was applied to each source-drain area. In this test, each transistor group having a current smaller than 100 an was evaluated as a good one. The results are shown in FIG. 2.

Figure 2:
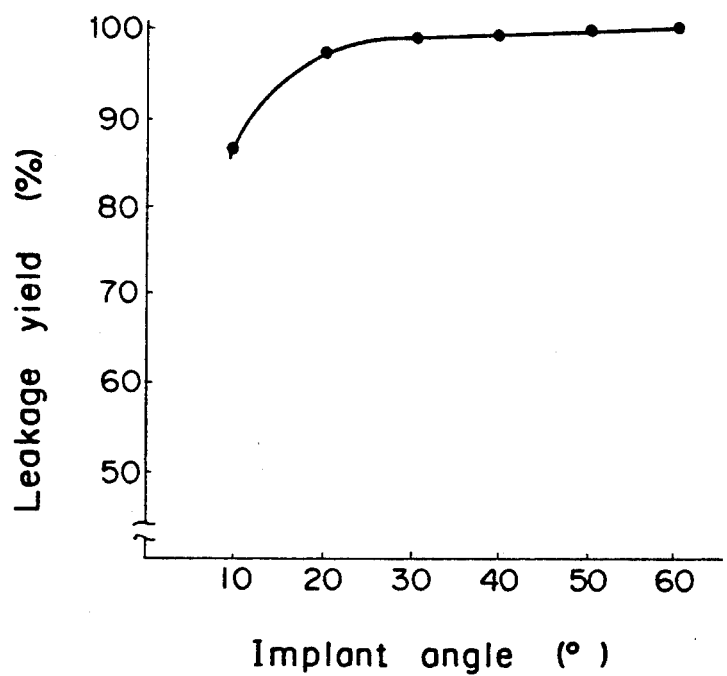
FIG. 2 is a graph showing the implant angle dependency of the leakage yield of diodes according to the first preferred embodiment.

As shown in FIG. 2, a significant improvement in yield is observed by increasing the implantation angle to greater than 20 degrees. Furthermore, if the implantation angle is further increased, the angle formed by the two crystal growth directions 7 and 8 in the amorphous layer 6 becomes even more acute, and the probability of void generation decreases further.

Devices were isolated in this process by depositing a 160 nm nitride layer on a 20 nm underlying oxide layer for selective oxidation. The device isolation width was 0.55 μm in the mask dimensions. It was also discovered that the isolation by buring a trench drops the yield further because of higher stress due to the trench isolation. However, by employing a 20 degree implantation angle, the drop in yield was not observed even in the case of the trench isolation. In other words, the effects of stress were virtually eliminated because no nuclei contributing to defect formation were formed according to the present invention.

It is to be noted that while the amorphous layer 6 was formed using arsenic ions in the present embodiment, the same effect is obtained using other ion types, including phosphorus and BF$_2$. Furthermore, the n-type layer 5 was formed in the p-type silicon substrate 1, and the amorphous layer 6 was formed in the n-type layer 5 in this embodiment, but it is also possible to form the p-type layer in the n-type substrate and to form the n-type layer containing the amorphous layer therein.

Further, it is possible to form an amorphous layer in a structure having a conductive type inversed from those mentioned above.

Second embodiment

A second embodiment of the present invention is described below with reference to FIG. 3, which illustrates the manufacturing process of a semiconductor device according to the second embodiment.

Because electrically active ions penetrate sufficiently below the mask in the method described in the first embodiment above, strong electrical effects cause aberrations in the characteristics due, for example, to short channel effects. Therefore, the second embodiment of the invention provides a method of forming only the amorphous layer smoothly using electrically inactive ions in the silicon.

Figure 3A:
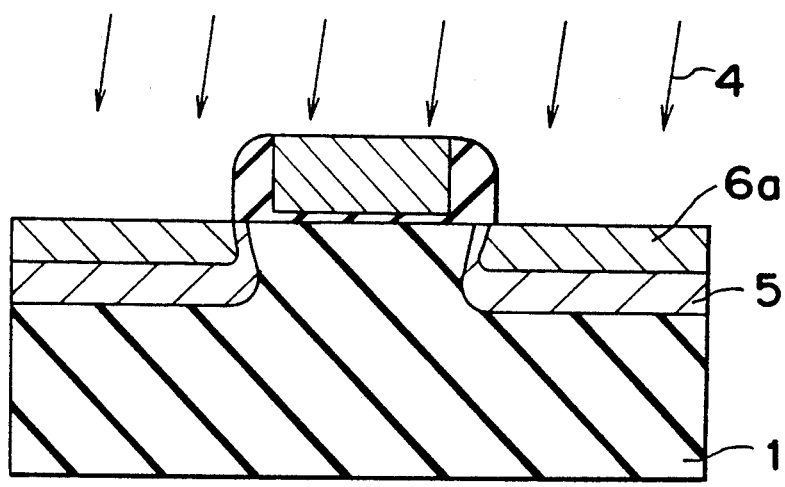
FIGS. 3(a) and 3(b) are schematical cross-sectional views of a semiconductor device for showing a large angle ion implantation according to a second preferred embodiment of the present invention.
Figure 3B:
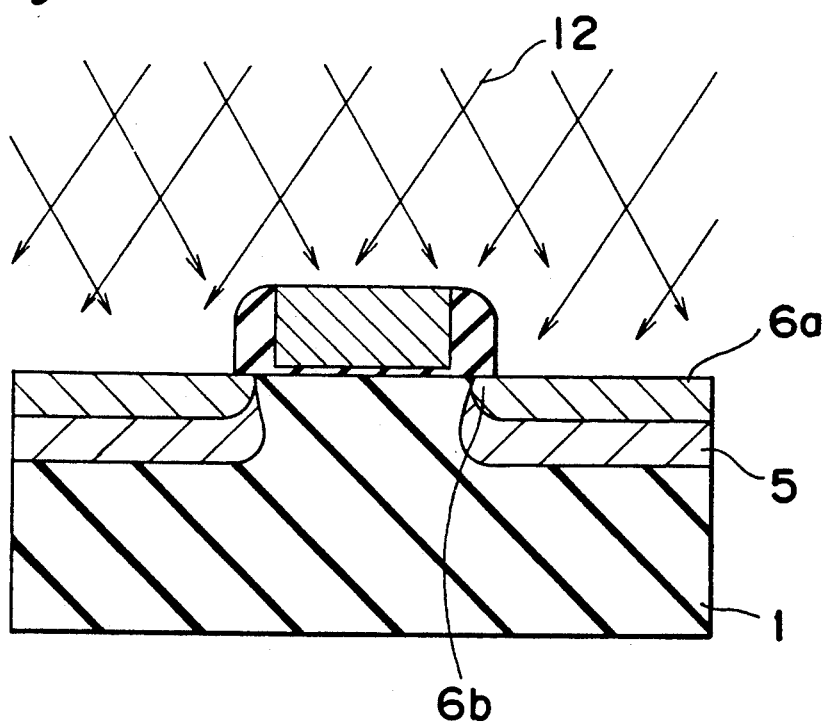
Figure 4A:
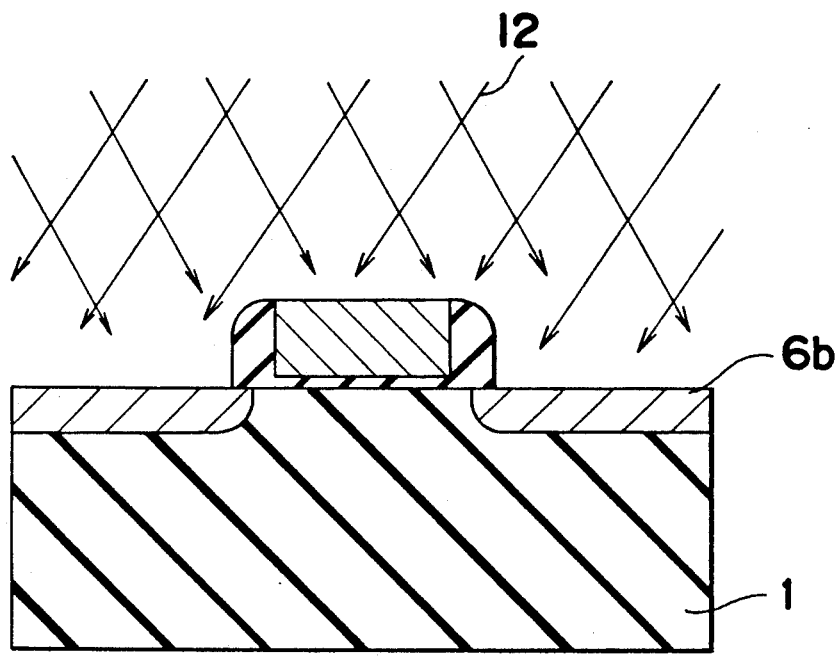
FIGS. 4(a) and 4(b) are schematical cross-sectional views of a semiconductor device for showing a large angle ion implantation according to a third preferred embodiment of the present invention.
Figure 4B:
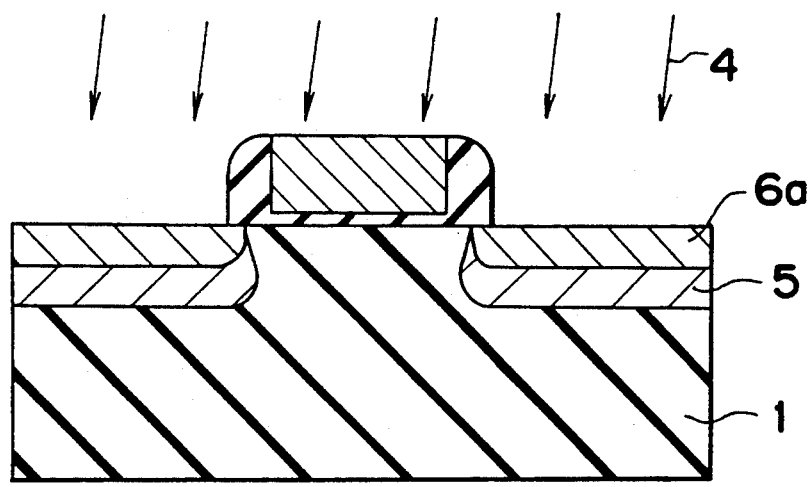

As shown in FIG. 3 (a), by implanting ions using an ion beam 4 having a small incident angle, for example 7 degrees, an n-type layer 5 and a first amorphous layer 6a are formed at first. Then, by implanting silicon ions 12 with a dose amount of 3 × 10$^{15}$ cm$^{-2}$ using a rotating or step rotation method at 20 degree implantation angle as shown in FIG. 3 (b), a second amorphous layer 6b is formed at the edge of the first amorphous layer 6a, resulting in the amorphous layer 6 having a dull corner underlying below the mask to the arsenic ions.

This makes it possible to suppress the defect generation effectively.

Although the shape of the corner of the amorphous layer under the mask material was made smooth by the silicon ion implantation after the arsenic ion implantation in the present embodiment, the same effect can be obtained under the same ion implantation conditions used in FIG. 3 by first implanting silicon ions to form a first amorphous layer 6b, followed by arsenic ion implantation to form a second amorphous layer 6a overlapping the first amorphous layer 6b.

Figure 5A:
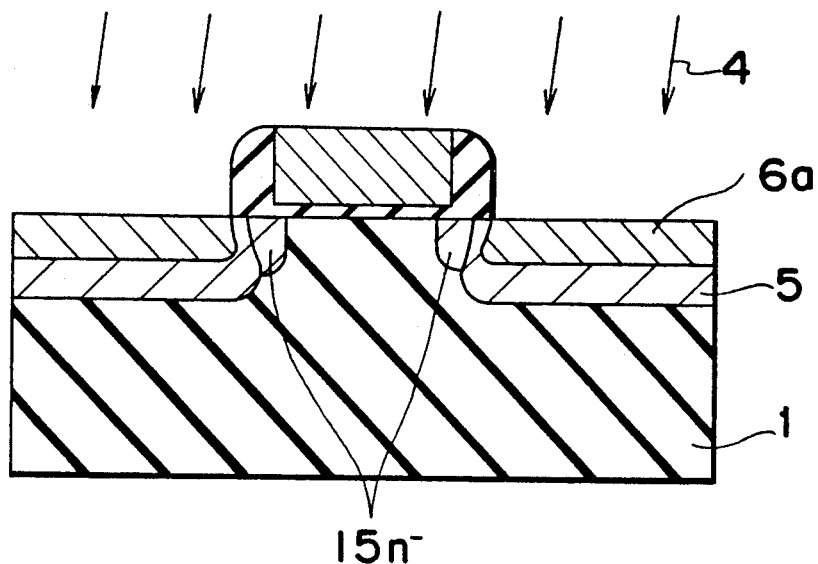
FIGS. 5(a) and 5(b) are schematical cross-sectional views for showing a method for forming an LDD structure according to the present invention.
Figure 5B:
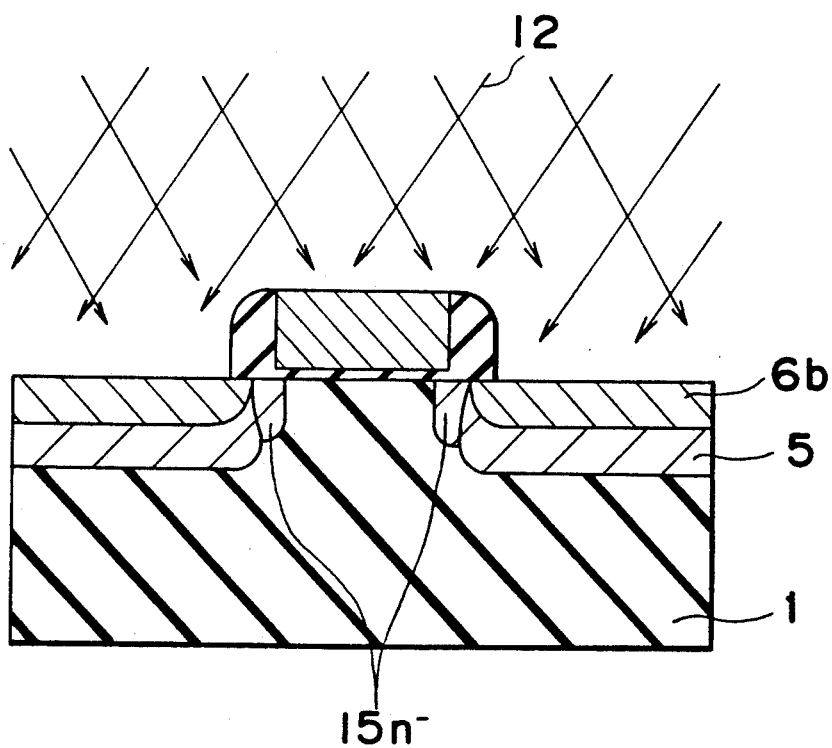
Figure 6:
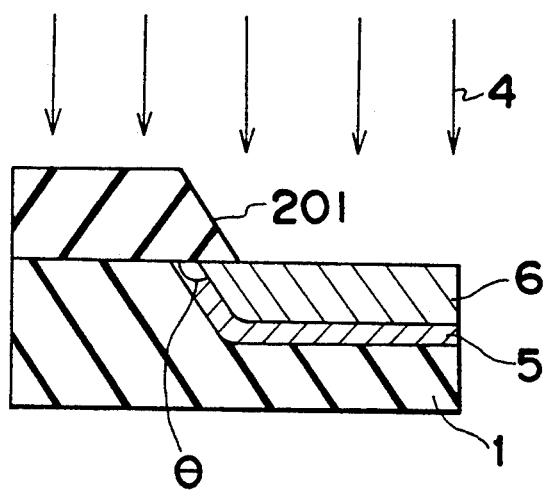
FIG. 6 is a cross-sectional view for showing a conventional ion implanting method using a tapered mask.
Figure 7:
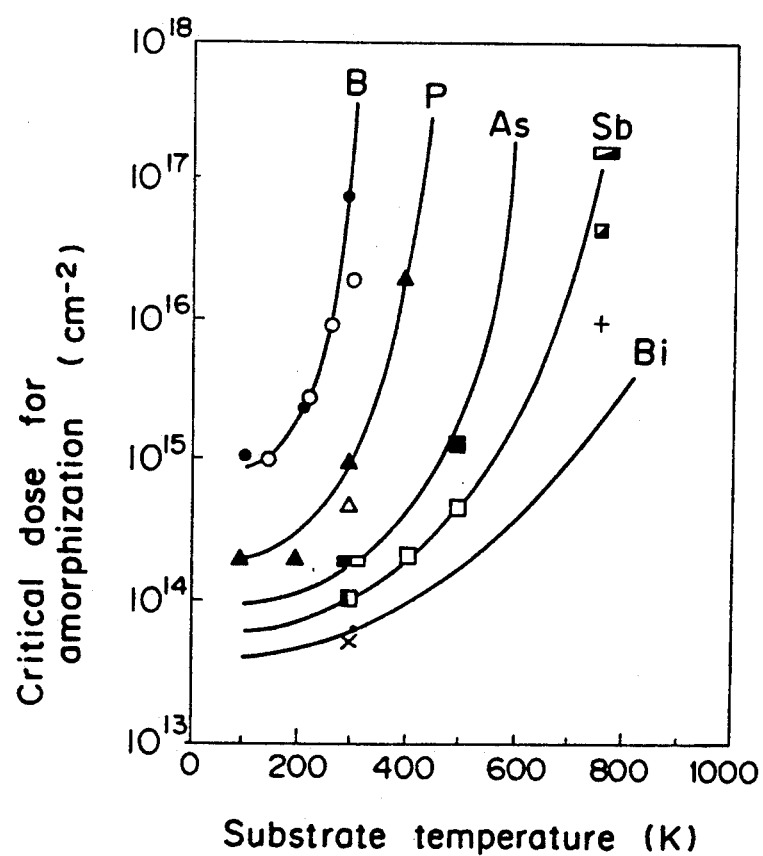
FIG. 7 is a graph showing a substrate temperature dependency of the critical dose for amorphization.

Moreover, because there is a possibility of the amorphous layer 6 projecting beyond the n-type layer 5 in the present embodiment, by implanting phosphorus ions at 1 × 10$^{13}$ cm$^{-2}$ dose amount before forming the first amorphous layer 6a in FIG. 3 (a) to obtain an LDD (FIG. 5) or LATID structure with a low concentration n-type area 15 formed inside the p-type silicon substrate 1, the low concentration n-type area 15 contains the amorphous layer 6 and eliminates the cause of leakage current generation.

It is to be noted that while silicon ions were used as the electrically inactive ions in the present embodiment, the same effect can be obtained by using at least one ion selected from germanium, argon, nitrogen, or fluorine ion group, or by using a molecular ion containing these ions, e.g., SiF2 or GeF2. In particular, an amorphous layer can be formed at a low dose if an ion with a higher mass number than a silicon ion, e.g., germanium ion, is used. In addition, if the amorphous layer is formed under the mask material using a large angle ion implantation at a low temperature such as that of liquid nitrogen, the amorphous layer can be formed at an even lower dose. In addition, while arsenic ions were used to form an impurity area, the same effect can be obtained using non-arsenic ions such as phosphorus or BF2 ions.

Further the present invention is applicable to all cases wherein formation of an amorphous layer is made by the ion implantation using a mask.

Figure 12:
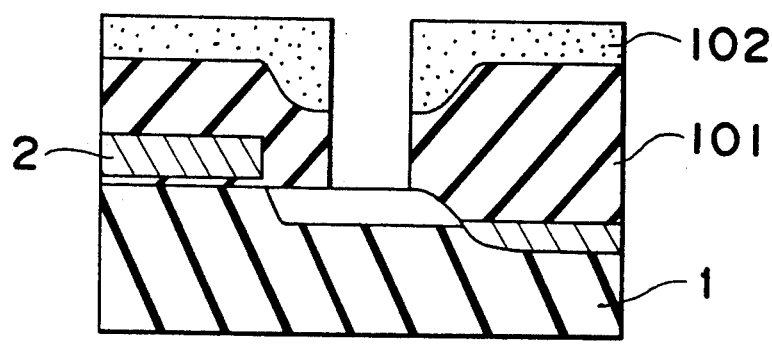
FIGS. 12 and 13 are schematical cross-sectional views for showing a method for forming a contact area to a contact hole for a charge storage capacitor.
Figure 13:
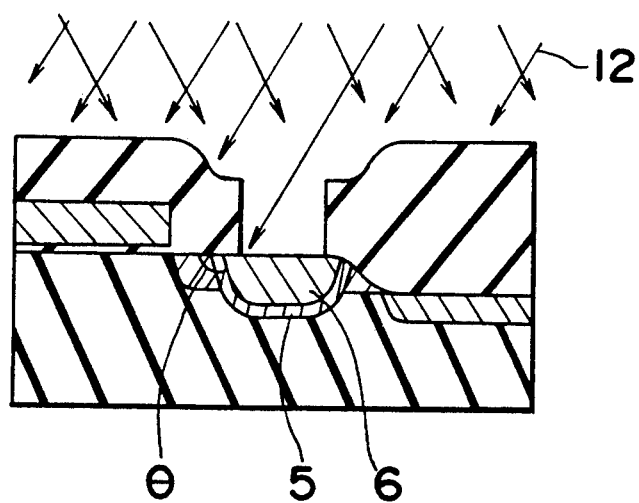
Figure 14A:
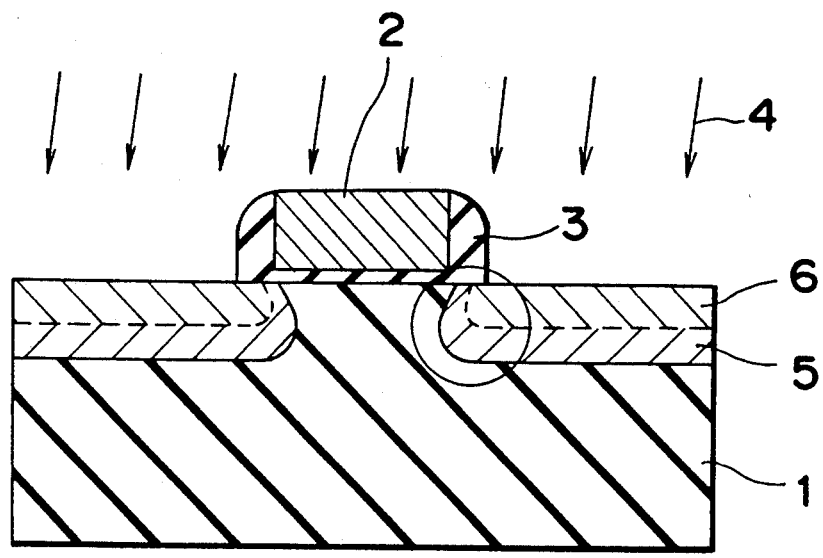
FIG. 14(a) is a schematical cross-sectional view of a semiconductor device for showing a conventional small implant angle ion implantation for forming an amorphous layer.
Figure 14B:
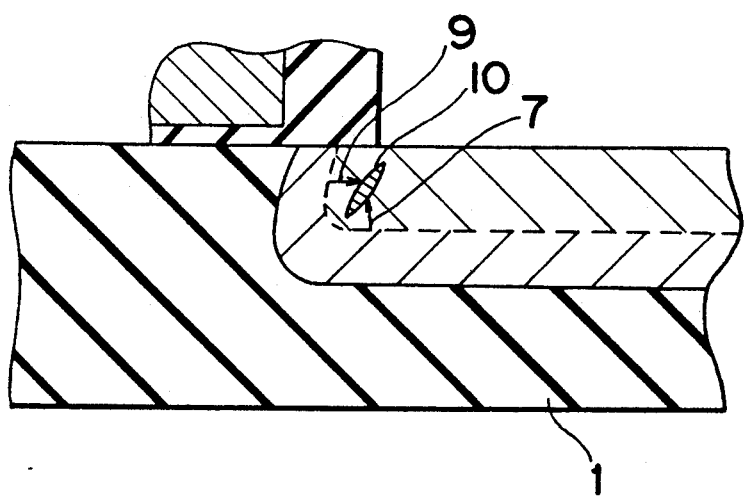
FIG. 14(b) is an enlarged view of a part of FIG. 14(a).

FIGS. 12 and 13 show an example applied to formation of a contact region to a contact hole for a charge storage electrode of DRAM.

FIG. 12 shows a state wherein a contact hole is formed in an oxide film 101 using a photoresist mask 102. After removing the mask 102, an ion implantation is carried out at a large implant angle to form an n-type layer 5 and an amorphous layer 6 below the contact hole as shown in FIG. 13. In this case, since the ion implant should be limited to one channel, the other channel is covered by a resist mask.

As indicated in FIG. 13, the angle θ of the edge of the amorphous layer 6 becomes dull as the result of the large angle ion implantation.

Although it is desirable to perform the large angle ion implantation after removing the photoresist mask because ions are easily implanted, it is possible without removing the same. However, in this case, it is desirable to form tapered holes in the photoresist mask since ions can be easily implanted.

Further, the present invention is applicable to the ion implantation to an emitter of a bi-polar transistor. In this case, the large angle ion implantation is limited to form an amorphous area.

Furthermore, while a silicon substrate was used in the first and second embodiments described above, good effects are also obtained with a compound semiconductor substrate, including GaAs and InP.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A large angle ion implanting method for forming amorphous layers in a semiconductor substrate comprising:
    a step of forming a mask pattern on said semiconductor substrate, said mask pattern having apertures for forming said amorphous layers; and
    a step of rotational implanting ions into said semiconductor substrate through said apertures of said mask pattern at a large implant angle equal to twenty degrees or more, when measured from a vertical line, with a dose amount necessary for forming said amorphous layers in said semiconductor layer and, thereby, forming each of said amorphous layers so as to have a substantially inverse trapezoidal vertical cross section each end of which is located beneath an edge of said mask pattern defining an aperture thereof.

2. The large angle ion implanting method as claimed in claim 1 wherein said semiconductor substrate is a silicon substrate.

3. The large angle ion implanting method as claimed in claim 2 wherein said implanting ions are arsenic ions.

4. A large angle ion implanting method for forming amorphous layers in a semiconductor substrate comprising:

a step of forming a mask pattern on a silicon substrate as said semiconductor substrate, said mask pattern having apertures for forming said amorphous layers; and a step of rotational implanting ions into said silicon substrate through said apertures of said mask pattern at a large implant angle equal to twenty degrees or more, when measured from a vertical line, with a dose amount necessary for forming said amorphous layers in said silicon substrate and, thereby, forming each of said amorphous layers so as to have a substantially inverse trapezoidal vertical cross section each end of which is located beneath an edge of said mask pattern defining an aperture thereof, wherein said implanting ions are ions electrically inactive in said silicon substrate.

5. The large angle ion implanting method as claimed in claim 4 wherein said ions electrically inactive in said silicon substrate are selected from the group consisting of silicon ion, germanium ion, argon ion, nitrogen ion, fluorine ion and molecular ion containing these ions.

6. The large angle ion implanting method as claimed in claim 5 wherein said ion implanting is carried out while maintaining said silicon substrate at a low temperature which is sufficiently low to form said amorphous layers at a lower dose of said implanting ions than when a higher temperature is employed.

7. The large angle ion implanting method for forming amorphous layers in a semiconductor substrate comprising:

a step of forming a mask pattern on said semiconductor substrate, said mask pattern having apertures for forming said amorphous layers;

a step of implanting ions electrically inactive in said semiconductor substrate through said apertures of said mask pattern at a large implant angle equal to twenty degrees or more to form first amorphous layers; and a step of implanting ions electrically active in said semiconductor substrate through said apertures of said mask pattern whereby second amorphous layers overlapping said first amorphous layers partially and impurity layers surrounding said first and second amorphous layers from the underside are formed.

8. The large angle ion implanting method as claimed in claim 7 wherein said step of implanting ions electrically active is comprised of a first step of implanting ions electrically active at a small angle ,and a second step of implanting ions electrically active at an angle larger than said small angle.

9. The large angle ion implanting method as claimed in claim 1, wherein said ion implanting method is applied to the formation of source-drain regions of a MOS transistor.

10. The large angle ion implanting method as claimed in claim 1, wherein said ion implanting method is applied to the formation of a contact region.

* * * * *